(12) United States Patent
Ando et al.

(10) Patent No.: US 6,218,770 B1
(45) Date of Patent: Apr. 17, 2001

(54) PIEZOELECTRIC ELEMENT (75) Inventors: Akira Ando, Omihachiman; Koichi Hayashi, Shiga-ken, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/270,864

(22) Filed: Mar. 17, 1999

(30) Foreign Application Priority Data

Apr. 20, 1998 (JP) .................................................. 10-109075

(51) Int. Cl.[7] .................................................. H01L 41/08
(52) U.S. Cl. .......................... 310/354; 310/330; 310/332; 310/366
(58) Field of Search ..................... 310/359, 366

(56) References Cited

U.S. PATENT DOCUMENTS

| | | | |
|---|---|---|---|
| 2,540,194 | * | 2/1951 | Ellett ................. 310/359 X |
| 2,540,412 | * | 2/1951 | Adler ................. 310/359 X |
| 3,071,841 | * | 1/1963 | Brussaard et al. ........ 310/358 X |
| 3,114,849 | * | 12/1963 | Poschenrieder .......... 310/359 X |
| 3,252,017 | * | 5/1966 | Bartels ............... 310/359 X |
| 3,365,592 | * | 1/1968 | Krautwald et al. ....... 310/359 X |
| 4,491,761 | * | 1/1985 | Grudkowski et al. ...... 310/359 |
| 4,638,206 | * | 1/1987 | Tsunooka et al. ........ 310/359 X |
| 4,788,468 | * | 11/1988 | Izukawa et al. ......... 310/359 X |
| 5,576,590 | * | 11/1996 | Ohnishi et al. ......... 310/359 |
| 5,861,704 | * | 1/1999 | Kitami et al. .......... 310/366 X |

* cited by examiner

*Primary Examiner*—Mark O. Budd
(74) *Attorney, Agent, or Firm*—Keating & Bennett, LLP

(57) ABSTRACT

A piezoelectric element has a very small size, has a high coefficient of electromechanical coupling, and can easily be impedance-matched to a circuit. An interdigital electrode, including two comb-shaped electrodes, is provided on one surface of a plate-like piezoelectric member, and similarly, an interdigital electrode, including two comb-shaped electrodes, is provided on another surface of the plate-like piezoelectric member. The piezoelectric member is polarized by applying electrical fields between the two respective pairs of comb-shaped electrodes; and in addition, by applying an electrical field for excitation between a terminal connecting one of the comb-shaped electrodes to each interdigital electrode, and another terminal connecting the other comb-shaped electrodes to each interdigital electrode, longitudinal vibrations in a stiffened mode are excited, whereby the piezoelectric member expands and contracts in the longitudinal direction thereof.

17 Claims, 7 Drawing Sheets

PIEZOELECTRIC ELEMENT

BACKGROUND OF THE INVENTION

1. Field of the Invention

The present invention relates to a piezoelectric element, more particularly to a piezoelectric element used in technological fields such as data processing and communications and functioning as a resonator, a filter and the like.

2. Description of the Related Art

A piezoelectric element includes, for instance, a piezoelectric member made of piezoelectric ceramic. This type of piezoelectric member is adapted to vibrate in a square type vibration mode or a thickness vibration mode and is widely used.

Figure 10:
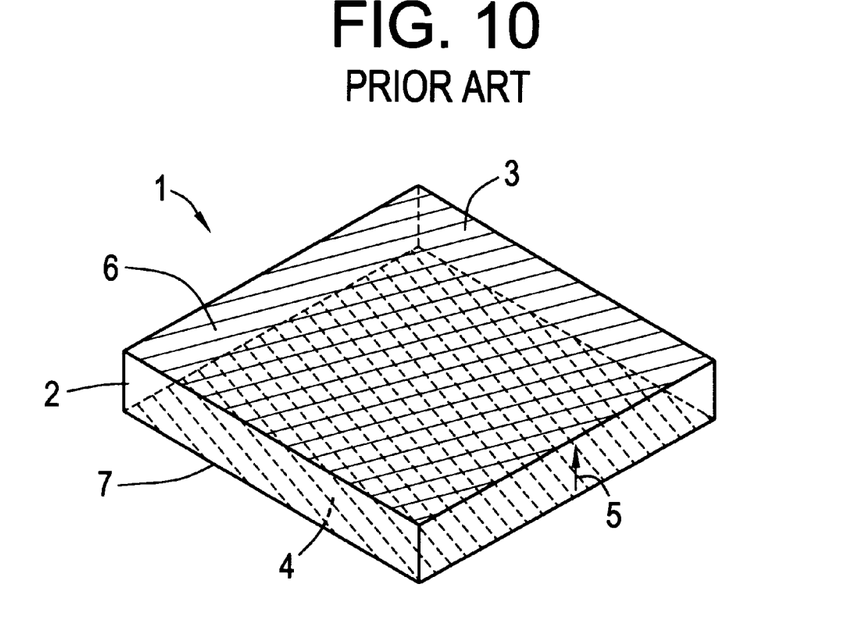
FIG. 10 is a perspective view of a conventional piezoelectric element utilizing a square type vibration of interest to the present invention.

FIG. 10 shows a piezoelectric element 1 adapted to vibrate in a square type vibration mode. The piezoelectric element 1 includes a square plate-like piezoelectric member 2, and electrodes 3 and 4 are provided on the major surfaces of the piezoelectric member 2.

The piezoelectric member 2 is polarized in the direction indicated by an arrow 5, and square type vibrations are excited by applying an electrical field between the electrodes 3 and 4 via terminals 6 and 7.

Figure 11:
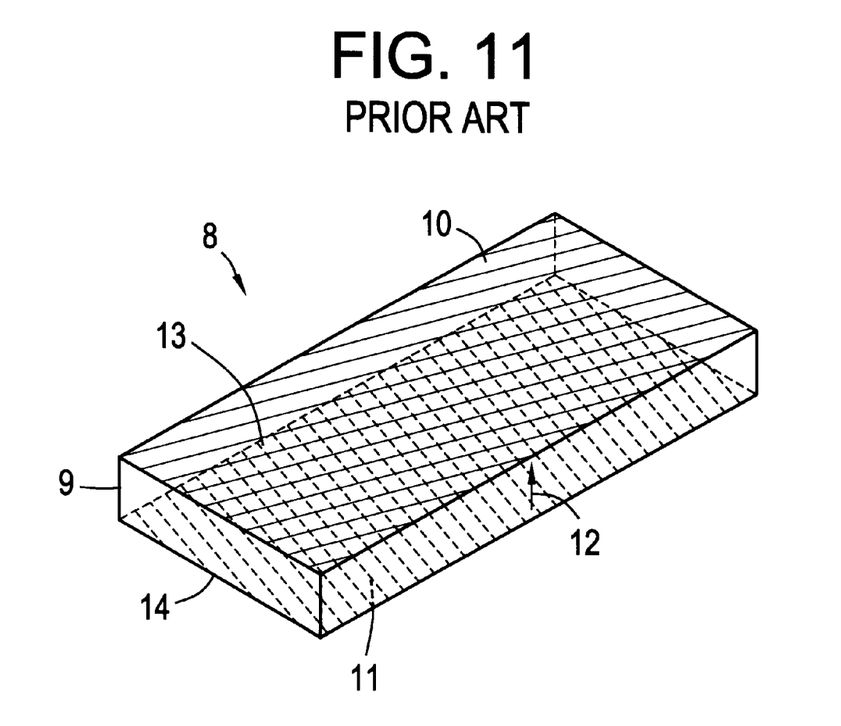
FIG. 11 is a perspective view of a conventional piezoelectric element utilizing an unstiffened vibration mode, of interest to the present invention.

FIG. 11 shows a piezoelectric element 8 utilizing an unstiffened vibration mode. The piezoelectric element 8 includes a thin plate-like piezoelectric member 9, and electrodes 10 and 11 are provided on the major surfaces of the piezoelectric member 9.

The piezoelectric member 9 is polarized in the direction indicated by an arrow 12, and longitudinal vibration in the unstiffened mode is excited by applying an electrical field between the electrodes 10 and 11 via terminals 13 and 14.

Figure 12:
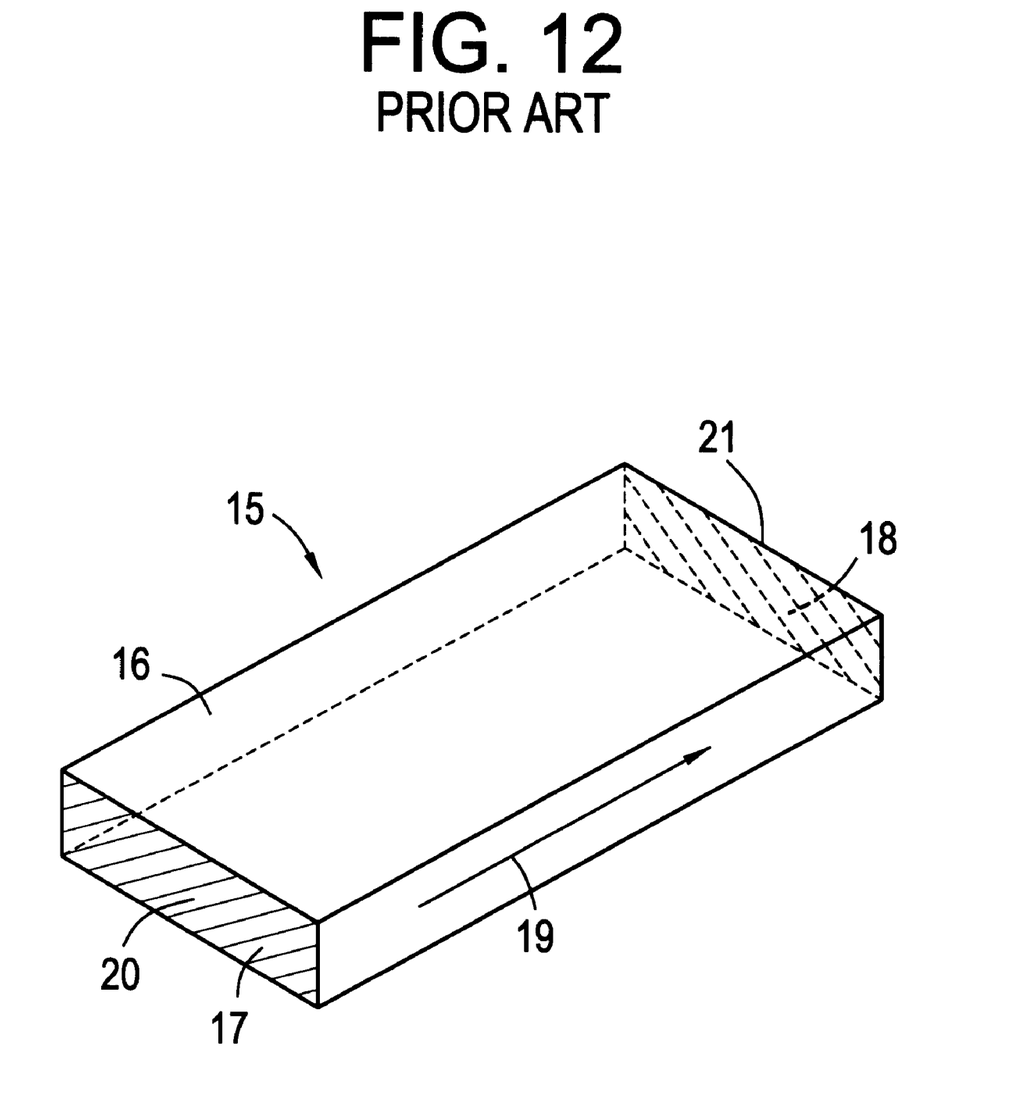
FIG. 12 is a perspective view of a conventional piezoelectric element 15 utilizing a stiffened vibration mode, of interest to the present invention.

FIG. 12 shows a piezoelectric element 15 utilizing a stiffened vibration mode. The piezoelectric element 15 includes a thin plate-like or rod-like piezoelectric member 16, and electrodes 17 and 18 are provided on the major surfaces of the piezoelectric member 16.

The piezoelectric member 16 is polarized in the direction indicated by the arrow 19, and longitudinal vibration in a stiffened mode is excited by applying an electrical field between the electrodes 17 and 18 via terminals 20 and 21.

However, the piezoelectric elements 1, 8 and 15 shown in FIG. 10, FIG. 11 and FIG. 12 respectively have the following disadvantages.

Firstly, the piezoelectric element 1 shown in FIG. 10 is comparatively large, which prevents a circuit or device incorporating such element 1 from being made small. For instance, when the piezoelectric element 1 is used as an AM middle frequency filter in a 455 kHz radio, the piezoelectric member 2 must be a square plate-like piezoelectric member having approximate dimensions of 5 mm×5 mm, which is a considerable barrier to miniaturizing an electronic circuit or device incorporating such piezoelectric member 2.

Furthermore, in the case of the piezoelectric element 8 shown in FIG. 11, when the piezoelectric member 9 has a thin plate-like shape which is approximately 4 mm in length in order to make the piezoelectric element 8 small, a wide filter pass band cannot be achieved.

Furthermore, in the piezoelectric element 15 shown in FIG. 12, when the piezoelectric member 16 has thin rod-like shape of, for instance, approximately 4 mm in length in order to make the piezoelectric element 15 small, impedance is too high and the impedance cannot easily be matched with the impedance of a circuit incorporating the element 15.

SUMMARY OF THE INVENTION

In order to overcome the problems described above, preferred embodiments of the present invention provide a piezoelectric element which has a very small size, is easily impedance-matched to a circuit, and has high performance.

A preferred embodiment of the present invention provides a piezoelectric element, including a plate-like or rod-like piezoelectric member, and at least one interdigital electrode including two comb-shaped electrodes and provided on at least one surface of the piezoelectric member, wherein the piezoelectric member is polarized or aligned by applying an electrical field between the two comb-shaped electrodes, and the piezoelectric element is adapted to vibrate in a stiffened mode by applying an electrical field between the two comb-shaped electrodes.

According to the above described structure and arrangement, since the piezoelectric element is vibrated in a stiffened mode and thereby expanded and contracted in the longitudinal direction thereof, the piezoelectric element of preferred embodiments of the present invention can be made small in size, enabling an electronic device incorporating such element to be very small also, and is easily impedance-matched to a circuit, and achieves a wide pass band when, for instance, used as a filter or the like.

In the above described piezoelectric element, the interdigital electrodes are preferably respectively provided on at least two surfaces of the piezoelectric member. The two surfaces of the piezoelectric member are preferably substantially parallel to each other.

According to the above described structure and arrangement, the piezoelectric member can be more efficiently polarized and aligned, and in addition, it can be more efficiently excited. Furthermore, when interdigital electrodes are provided on two surfaces of a piezoelectric member so as to be substantially parallel to each other, it is easier to form the interdigital electrodes than when the interdigital electrodes are provided on two surfaces which are not substantially parallel. Moreover, such surfaces can be more easily polished prior to forming the interdigital electrodes thereon.

In the above described piezoelectric element, one of the comb-shaped electrodes constituting the interdigital electrode provided on one of the two surfaces of the piezoelectric member, is preferably electrically connected to the other of the comb-shaped electrodes constituting the interdigital electrode provided on the other of the two surfaces of the piezoelectric member.

According to the above described structure and arrangement, the piezoelectric member can be more efficiently excited.

In the above described piezoelectric element, one of the surfaces of the piezoelectric element on which the interdigital electrode is provided is preferably a polished surface.

According to the above described structure and arrangement, the polished surface is smooth, making it possible to effectively use photolithography to form the interdigital electrodes.

In the above described piezoelectric element, a distance between two of the electrode fingers of the comb-shaped electrodes of the interdigital electrode may be different from a distance between the other two of the electrode fingers of the comb-shaped electrodes of the interdigital electrode. In this case, the distance between two of the electrode fingers of the comb-shaped electrodes of the interdigital electrode located at a center portion of the piezoelectric member is preferably larger than the distance between the other two of the electrode fingers of the comb-shaped electrodes of the interdigital electrode located at an end portion of the piezoelectric member.

According to the above described structure and arrangement, the portions where the distance between the electrode fingers is large has high impedance, with a resulting improvement in the coefficient of electromechanical coupling, while the portions where the distance between the electrode fingers is small helps to prevent increased impedance of the piezoelectric element. When the distance between electrode fingers is made greater in the center portion of the piezoelectric member and smaller at the end portion of the piezoelectric member, the level of polarization is increased in the center, as the center is a portion which considerably influences the coefficient of electromechanical coupling, thereby further raising the coefficient of electromechanical coupling and achieving greater effectiveness.

Other features and advantages of the present invention will become apparent from the following description of the invention which refers to the accompanying drawings.

DETAILED DESCRIPTION OF PREFERRED EMBODIMENTS

Figure 1:
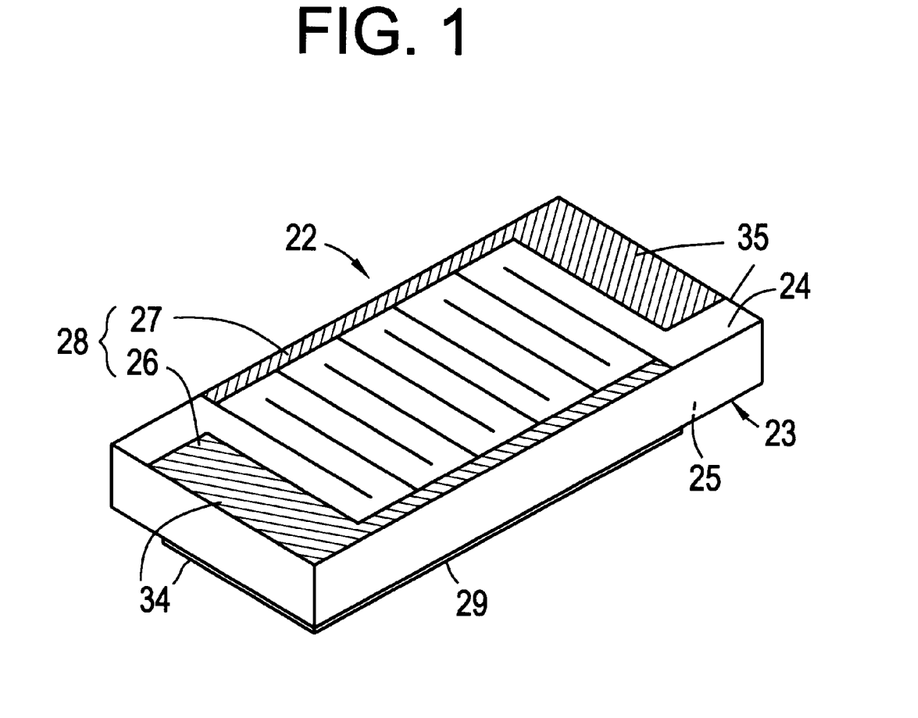
FIG. 1 is a perspective view of a piezoelectric element according to a first preferred embodiment of the present invention.
Figure 2:
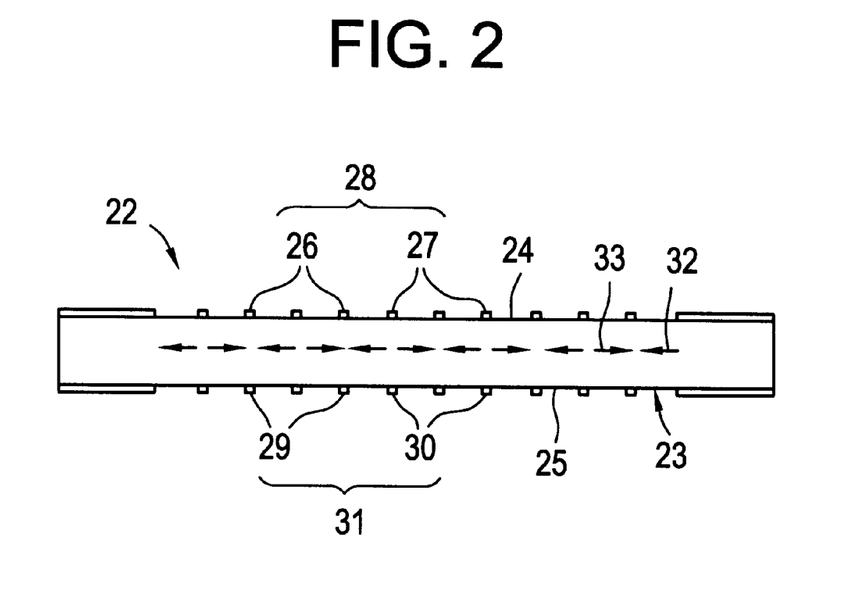
FIG. 2 is a longitudinal sectional view of the piezoelectric element shown in FIG. 1.

FIG. 1 and FIG. 2 show a piezoelectric element 22 according to a first preferred embodiment of the present invention, FIG. 1 being a perspective view and FIG. 2 being a longitudinal cross-sectional view.

The piezoelectric element 22 preferably includes, for instance, an elongated plate-like piezoelectric member 23 made of piezoelectric ceramic. The piezoelectric member 23 has two surfaces 24 and 25, which extend substantially parallel to each other and are polished smooth.

An interdigital electrode 28, including two comb-shaped electrodes 26 and 27, is provided on the first surface 24 of the piezoelectric member 23, and an interdigital electrode 31, including two comb-shaped electrodes 29 and 30, is provided on the second surface 25 of the piezoelectric member 23. The pattern of the interdigital electrode 31 is preferably a mirror image of the interdigital electrode 28, although this is not clearly shown in the diagram. The interdigital electrodes 28 and 31 can be formed by, for instance, photolithography.

The piezoelectric member 23 is polarized in the following way. Firstly, an electrical field is applied between the two comb-shaped electrodes 26 and 27, which define the interdigital electrode 28 on the first surface 24, while connecting the comb-shaped electrode 26 to ground. An electrical field is applied between the two comb-shaped electrodes 29 and 30, which form the interdigital electrode 31 on the second surface 25, while connecting the comb-shaped electrode 27 to ground.

In this way, the piezoelectric member 23 is polarized as shown by the arrows 32 and 33 in FIG. 2. That is, the piezoelectric member 23 is polarized from the comb-shaped electrodes 27 and 30 to the other comb-shaped electrodes 26 and 29 in each of the interdigital electrodes 28 and 31, so that adjacent regions, formed between the comb-shaped electrodes 27 and 30 and the other comb-shaped electrodes 26 and 29, are polarized in reverse directions relative to each other.

In order to excite the piezoelectric member 23 of the piezoelectric element 22, the comb-shaped electrode 26, which is one of the two comb-shaped electrodes of the interdigital electrode 28 on the first surface 24, and the comb-shaped electrode 29, which is one of the two comb-shaped electrodes of the interdigital electrode 31 on the first surface 25, are both connected to a terminal 34, so as to be electrically connected to each other; the other comb-shaped electrode 27 of the interdigital electrode 28 and the other comb-shaped electrode 30 of the interdigital electrode 31 are connected to a terminal 35 so as to be electrically connected to each other. In this state, when an alternating electrical field is applied as an electrical field between the terminals 34 and 35, longitudinal vibrations in a stiffened mode are excited in the piezoelectric member 23, causing the piezoelectric member 23 to expand and contract in the longitudinal direction thereof.

Figure 3:
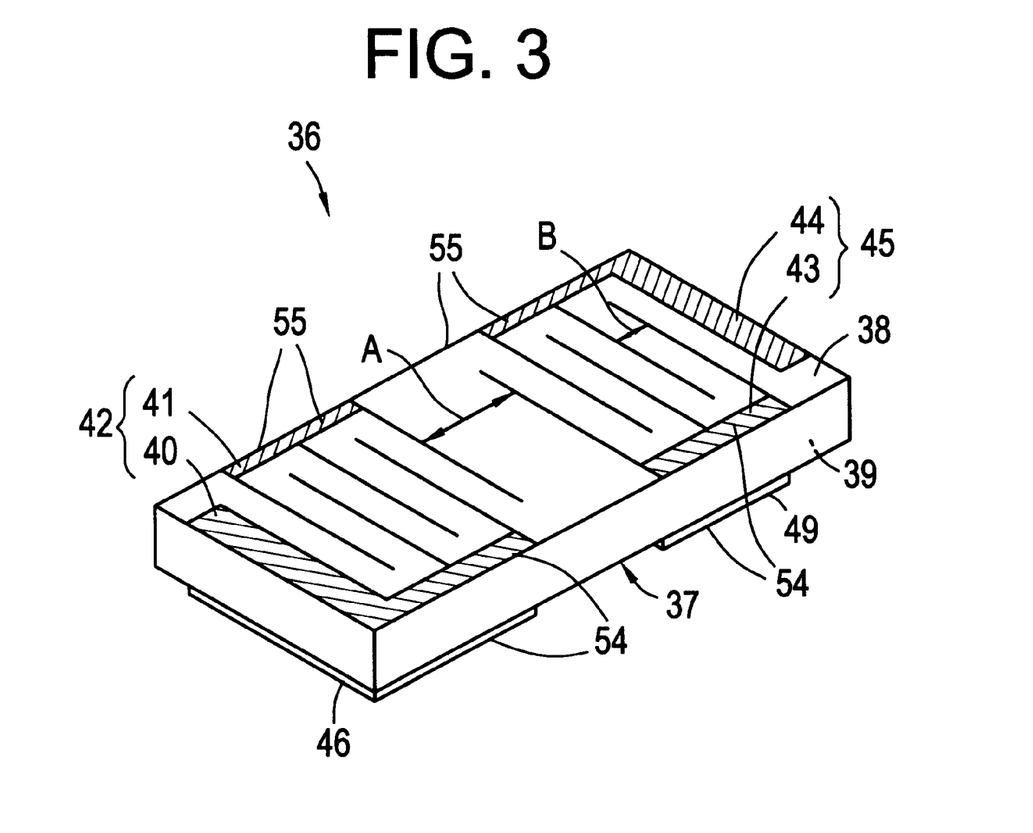
FIG. 3 is a perspective view of a piezoelectric element according to a second preferred embodiment of the present invention.
Figure 4:
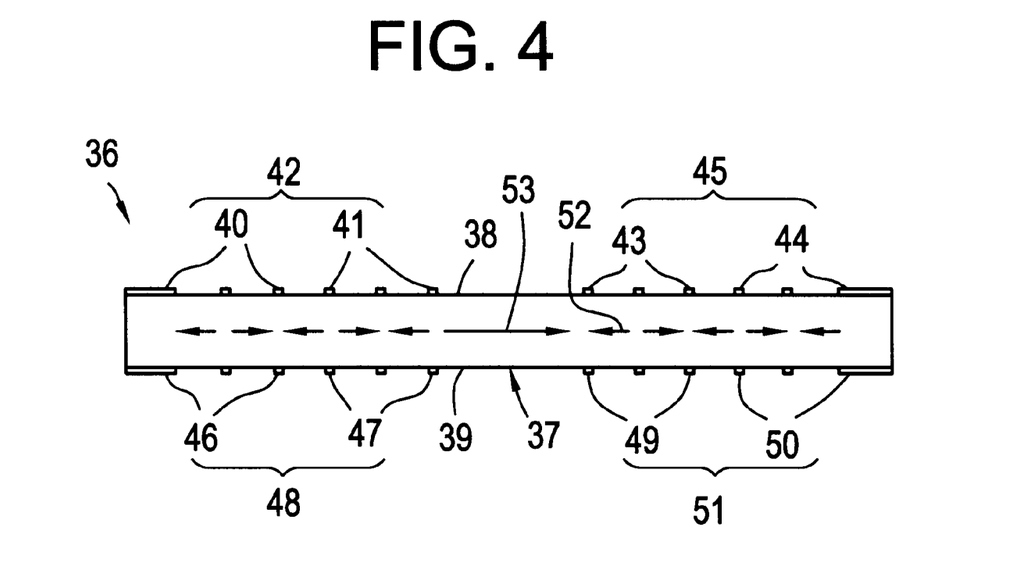
FIG. 4 is a longitudinal sectional view of the piezoelectric element shown in FIG. 3.

FIG. 3 and FIG. 4 show a piezoelectric element 36 according to a second preferred embodiment of the present invention, FIG. 3 being a perspective view and FIG. 4, a longitudinal cross-sectional view.

The piezoelectric element 36 includes an elongated plate-like piezoelectric member 37. The piezoelectric member 37 has two surfaces 38 and 39, which extend substantially parallel to each other and are polished smooth.

An interdigital electrode 42, including two comb-shaped electrodes 40 and 41, and an interdigital electrode 45, including two comb-shaped electrodes 43 and 44, are arranged to extend in the longitudinal direction on the first surface 38 of the piezoelectric member 37.

An interdigital electrode 48, including two comb-shaped electrodes 46 and 47, and an interdigital electrode 51, including two comb-shaped electrodes 49 and 50, are arranged to extend in the longitudinal direction on the second surface 39 of the piezoelectric member 37. Although not clearly shown in the drawing, the pattern of the interdigital electrodes 48 and 51, formed on the second surface 39, is preferably a mirror image of the pattern of the comb-shaped electrodes 42 and 45 on the first surface 38.

In this preferred embodiment, the piezoelectric member 37 is polarized by applying an electrical field between the comb-shaped electrodes 40 and 41, and between comb-shaped electrodes 43 and 44, which respectively form the interdigital electrodes 42 and 45 on the first surface 38, while connecting the comb-shaped electrodes 40 and 43 to ground; and similarly, an electrical field is applied between the two comb-shaped electrodes 46 and 47, and between comb-shaped electrodes 49 and 50, which form the interdigital electrode 48 and 51 on the second surface 39, while connecting the comb-shaped electrodes 46 and 49 to ground. In this way, the piezoelectric member 37 is polarized as shown by the arrows 52 and 53 in FIG. 4.

Furthermore, as shown in FIG. 3, in order to excite the piezoelectric member 37, the comb-shaped electrodes 40, 43, 46 and 49, each being one of the two comb-shaped electrodes of the interdigital electrodes 42, 45, 48 and 51, are all connected in common to a terminal 54, and the other comb-shaped electrodes 41, 44, 47 and 50 are all connected in common to another terminal 55. In this state, when an alternating electrical field is applied as an electrical field for excitation between the terminals 54 and 55, longitudinal vibrations in a stiffened mode are excited in the piezoelectric member 37, causing the piezoelectric member 37 to expand and contract in the longitudinal direction thereof.

In this preferred embodiment, a distance A defined between the electrode fingers of the comb-shaped electrodes 41 and 43, and between the electrode fingers of the comb-shaped electrodes 47 and 49, in the center portion of the piezoelectric member 37, is set to be larger than a distance B, which is the distance defined at the end portions of the piezoelectric member 37 between electrode fingers of the comb-shaped electrodes 40 and 41, between the electrode fingers of the comb-shaped electrodes 43 and 44, between the electrode fingers of the comb-shaped electrodes 46 and 47, and between the electrode fingers of the comb-shaped electrodes 49 and 50. This is for the following reason.

Generally, when the thickness of a piezoelectric member is larger than the distance between electrode fingers, the piezoelectric member cannot be adequately polarized, thereby reducing the coefficient of electromechanical coupling. Therefore, the distance between electrode fingers should preferably be larger than the thickness of the piezoelectric member. However, when the distance between electrode fingers is too large, the impedance of the piezoelectric element increases and it becomes difficult to achieve matching with a circuit. Accordingly, by setting the distance between electrode fingers in the center portion of the piezoelectric member so as to be large, which has a considerable effect on the coefficient of electromechanical coupling, and setting the distance between electrode fingers at the end portions of the piezoelectric member to be small, it is possible to prevent any increase in impedance while increasing the level of polarization in the center portion of the piezoelectric member, thereby increasing the coefficient of electromechanical coupling and allowing more efficient excitation of the piezoelectric member.

In this preferred embodiment, as described above, since the distance A in the center portion of the piezoelectric member 37 is larger than the distance B at the end portions of the piezoelectric member 37, there is a double effect of preventing any increase in impedance and increasing the coefficient of electromechanical coupling.

Figure 5:
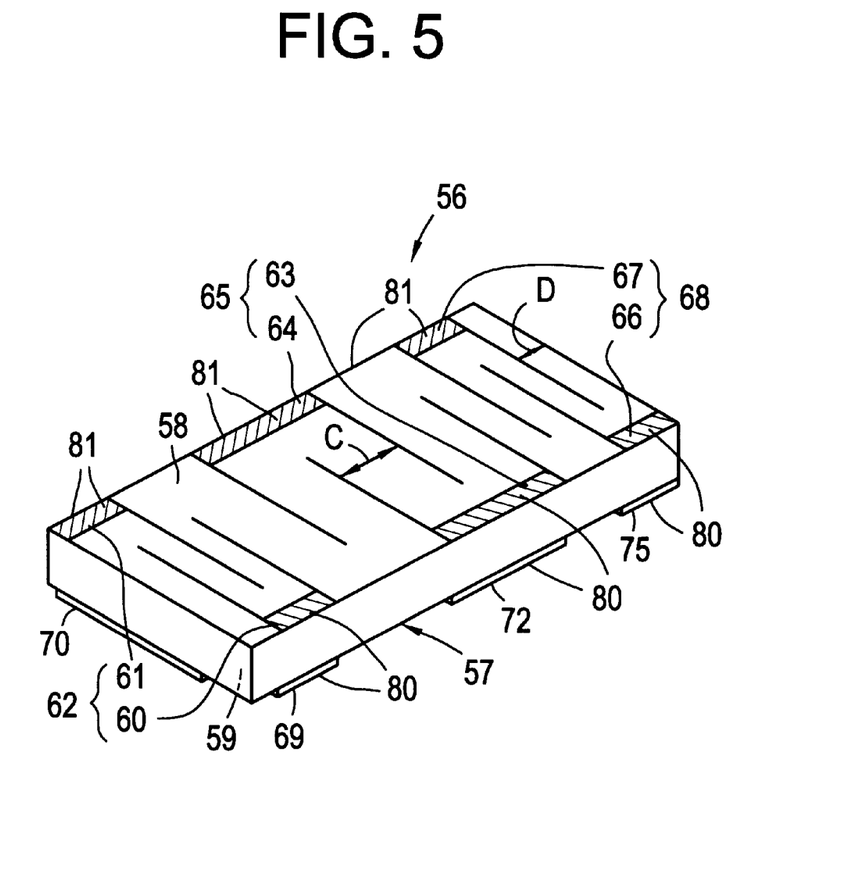
FIG. 5 is a perspective view of a piezoelectric element according to a third preferred embodiment of the present invention.
Figure 6:
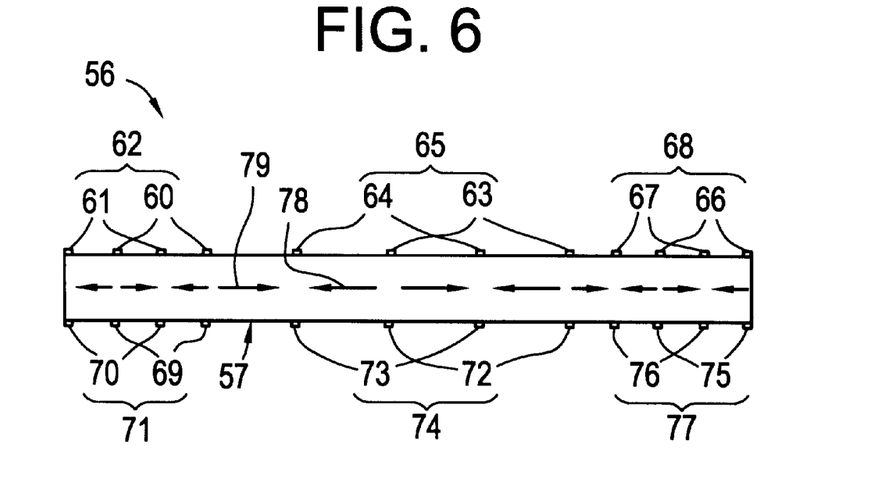
FIG. 6 is a longitudinal sectional view of the piezoelectric element shown in FIG. 5.

FIG. 5 and FIG. 6 show a piezoelectric element 56 according to a third preferred embodiment of the present invention, FIG. 5 being a perspective view and FIG. 6, a longitudinal cross-sectional view.

This piezoelectric element 56 includes an elongated plate-like piezoelectric member 57. The piezoelectric member 57 has two surfaces 58 and 59, which extend substantially parallel to each other.

An interdigital electrode 62, including two comb-shaped electrodes 60 and 61, an interdigital electrode 65, including two comb-shaped electrodes 63 and 64, and an interdigital electrode 68, including two comb-shaped electrodes 66 and 67, are arranged to extend in the longitudinal direction on the first surface 58 of the piezoelectric member 57.

An interdigital electrode 71, including two comb-shaped electrodes 69 and 70, an interdigital electrode 74, including two comb-shaped electrodes 72 and 73, and an interdigital electrode 77, including two comb-shaped electrodes 75 and 76, are arranged to extend in the longitudinal direction on the second surface 59 of the piezoelectric member 57. The patterns of the interdigital electrodes 71, 74 and 77 on the second surface 59 are respectively mirror images of the interdigital electrodes 62, 65 and 68 on the first surface 58.

In this preferred embodiment, the piezoelectric member 57 is polarized by applying an electrical field between the comb-shaped electrodes 60 and 61, between comb-shaped electrodes 63 and 64, and between comb-shaped electrodes 66 and 67, respectively forming the interdigital electrodes 62, 65 and 68 on the first surface 58, while connecting the comb-shaped electrodes 61, 64 and 67 to ground; and similarly, by applying an electrical field between the comb-shaped electrodes 69 and 70, between comb-shaped electrodes 72 and 73, and between comb-shaped electrodes 75 and 76, respectively forming the interdigital electrodes 71, 74 and 77 on the first surface 59, while connecting the comb-shaped electrodes 70, 73 and 76 to ground. As a consequence, the piezoelectric member 57 is polarized in the directions shown by the arrows 78 and 79 in FIG. 6.

Furthermore, to excite the piezoelectric member 57, the comb-shaped electrodes 60, 63, 66, 69, 72 and 75, each being one of the two comb-shaped electrodes of the interdigital electrodes 62, 65, 68, 71, 74 and 77, are all connected in common to a terminal 80, and the other comb-shaped electrodes 61, 64, 67, 70, 73 and 76 are all connected in common to another terminal 81. In this state, when an alternating electrical field is applied as an electrical field for excitation between the terminals 80 and 81, longitudinal vibrations in a stiffened mode are excited in the piezoelectric member 57, causing the piezoelectric member 57 to expand and contract in the longitudinal direction thereof.

In this preferred embodiment, as in the preferred embodiment shown in FIG. 3 and FIG. 4, the distance C in the center portion of the piezoelectric member 57 is set larger than the distance D at the end portions of the piezoelectric member 57. Therefore, it is possible to prevent impedance from increasing while increasing the level of polarization in the center portion of the piezoelectric member 57, thereby increasing the coefficient of electromechanical coupling and achieving more efficient excitation of the piezoelectric member.

Figure 7:
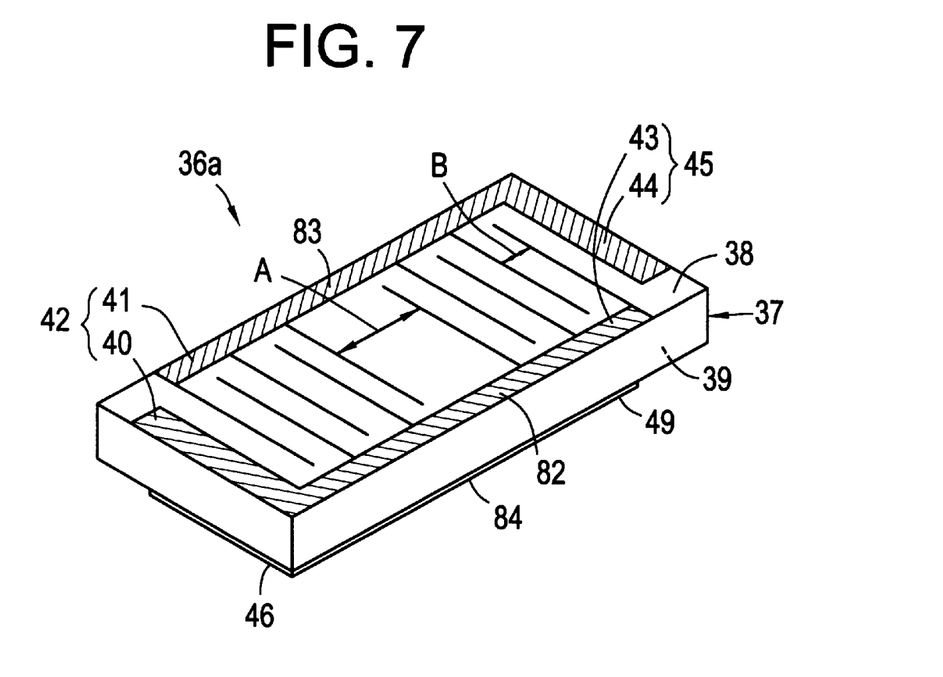
FIG. 7 is a perspective view of a piezoelectric element according to a fourth preferred embodiment of the present invention.

FIG. 7 is a perspective view of a piezoelectric element 36*a* according to a fourth preferred embodiment of the present invention. This piezoelectric element 36a corresponds to a modification of the piezoelectric element 36 shown in FIG. 3. Therefore, in FIG. 7, like members to those shown in FIG. 3 are designated by like reference numerals, and further explanation thereof is omitted.

In the piezoelectric element 36a shown in FIG. 7, a conductive pattern 82 is provided on the first surface 38 of the piezoelectric member 37 and connects the comb-shaped electrodes 40 and 43, which include one comb-shaped electrode each from the interdigital electrodes 42 and 45 on the first surface 38, and a conductive pattern 83 is provided on the same first surface 38 and connects the other comb-shaped electrodes 41 and 44.

On the other hand, a conductive pattern 84 is provided on the second surface 39 of the piezoelectric member 37 and connects the comb-shaped electrodes 46 and 49, which include one comb-shaped electrode each from the interdigital electrodes 48 and 55 on the second surface 39, and a conductive pattern (not shown in FIG. 7) is provided on the same second surface 39 and connects the other comb-shaped electrodes 47 and 50 (see FIG. 4).

In all other respects, the constitution of the piezoelectric element 36a of FIG. 7 is substantially the same as the piezoelectric element 36 shown in FIG. 3.

Figure 8:
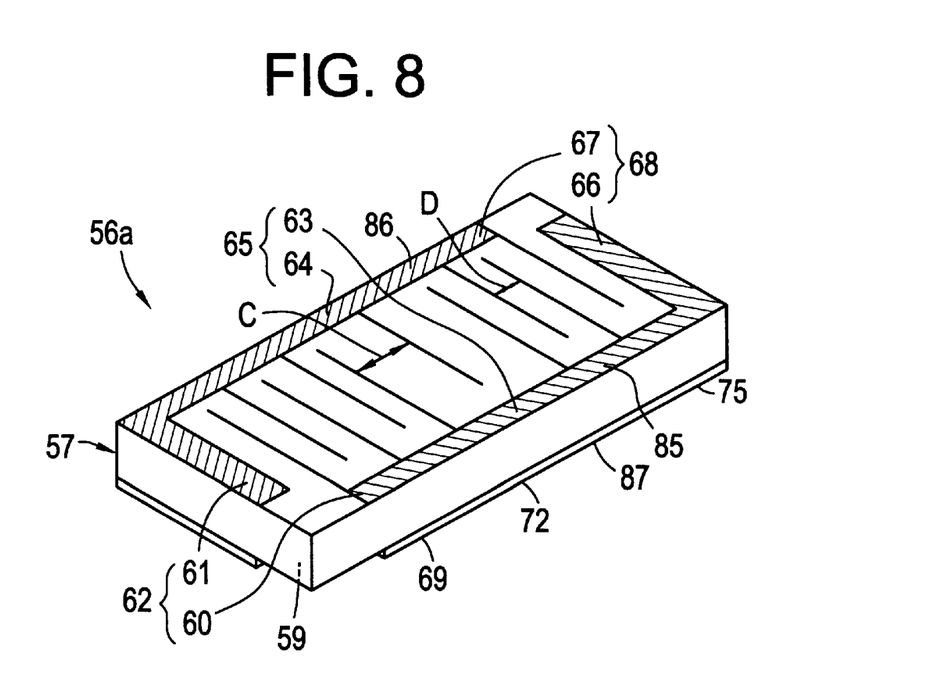
FIG. 8 is a perspective view of a piezoelectric element according to a fifth preferred embodiment of the present invention.

FIG. 8 is a perspective view of a piezoelectric element 36a according to a fifth preferred embodiment of the present invention. This piezoelectric element 56a corresponds to a modification of the piezoelectric element 56 shown in FIG. 5. Therefore, in FIG. 8, like members similar to those shown in FIG. 5 are designated by like reference numerals, and further explanation thereof is omitted.

In the piezoelectric element 56a shown in FIG. 8, a conductive pattern 85 is provided on the first surface 58 of the piezoelectric member 57 and connects the comb-shaped electrodes 60, 63 and 66, which include one comb-shaped electrode each from the interdigital electrodes 62, 65 and 68 on the first surface 58, and a conductive pattern 86 is provided on the same first surface 58 and connects the other comb-shaped electrodes 61, 64 and 67.

On the other hand, a conductive pattern 87 is provided on the second surface 59 of the piezoelectric member 57 and connects the comb-shaped electrodes 68, 72 and 75, which include one comb-shaped electrode each from the interdigital electrodes 71, 74 and 77 on the second surface 39, and a conductive pattern (not shown in FIG. 8) is provided on the same second surface 59 and connects the other comb-shaped electrodes 70 and 73 (see FIG. 6).

In all other respects, the constitution of the piezoelectric element 56a is substantially the same as the piezoelectric element 56 shown in FIG. 5.

While preferred embodiments of the present invention have been described, various other modifications thereto are possible within the scope of the invention.

For instance, in each of the preferred embodiments shown above, the piezoelectric member is plate-like, but it may be rod-like instead. Furthermore, when the piezoelectric member is rod-like, its cross-sectional shape is not restricted to that of a square, but may be any cross-sectional shape, such as triangular, for instance.

Furthermore, in the preferred embodiments described above, the interdigital electrodes were provided on substantially parallel first and second surfaces of the piezoelectric member, but the two surfaces of the piezoelectric member on which the interdigital electrodes are provided do not have to extend substantially parallel to each other in this way. For instance, when the piezoelectric member has a rod-like constitution which is triangular in cross-section, as mentioned above, that is, when it is a triangular prism, interdigital electrodes may be provided on two of the surfaces of this triangular prism.

Furthermore, interdigital electrodes can be provided on three or more surfaces of the piezoelectric member. For instance, when the piezoelectric member is a triangular prism as described above, the interdigital electrodes may be provided on each of the three side surfaces. Alternatively, just one interdigital electrode may be provided on one surface of the piezoelectric member.

Furthermore, in the preferred embodiment shown for instance in FIG. 1 and FIG. 2, the comb-shaped electrodes 26 and 27, provided on the first surface 24 of the piezoelectric member 23, are electrically connected to comb-shaped electrodes 29 and 30, provided on the second surface 25, by a common connection to terminals 34 and 35. However, this electrical connection can be achieved by providing a conductive pattern on side surfaces or end surfaces extending between the first and second surfaces 24 and 25 of the piezoelectric member 23.

Furthermore, in each of the preferred embodiments described above, it is possible to alter the number of interdigital electrodes, the number of comb teeth contained in a comb-shaped electrode, the distance between comb teeth, the width of comb teeth, the length of intersections between comb teeth, and the like.

There will be detailed below an experiment performed to confirm the effects of preferred embodiments of the present invention.

Experiment

A piezoelectric plate, including a piezoelectric ceramic of a composition expressed by $Pb_{0.95}Sr_{0.05}(Ti_{0.50}Zr_{0.50})O_3+1$ mol % $MnO_{02}$, was prepared. Using this piezoelectric plate as a piezoelectric member, the piezoelectric element 22 shown in FIG. 1 (Preferred Embodiment 1), the piezoelectric element 36 shown in FIG. 3 (Preferred Embodiment 2), the piezoelectric element 56 shown in FIG. 5 (Preferred Embodiment 3), the piezoelectric element 1 shown in FIG. 10 (Comparative Example 1), the piezoelectric element 8 shown in FIG. 11 (Comparative Example 2), and the piezoelectric element 15 shown in FIG. 12 (Comparative Example 3), were manufactured by the following procedures.

In each of the Preferred Embodiments 1~3 and Comparative Examples 1~3, the piezoelectric member was polished until its thickness was about 0.3 mm, and surface roughness was approximately 1 $\mu$m. Furthermore, the flat surfaces of the piezoelectric member had approximate dimensions of 1 mm×3.6 mm in Preferred Embodiments 1~3 and Comparative Examples 2 and 3, and 4.8 mm×4.8 mm in Comparative Example 2.

Then, interdigital electrodes were provided on the piezoelectric member in the aspects shown in the respective drawings for each of the Preferred Embodiments 1~3, and, in the Comparative Examples 1~3, electrodes were provided on the piezoelectric member in the aspects shown in the respective drawings. In the Preferred Embodiments 1~3 and Comparative Examples 1 and 2, the interdigital electrodes and electrodes were provided on the polished surfaces of the piezoelectric member.

In Preferred Embodiments 1~3, the width of the comb teeth of the comb-shaped electrodes forming the interdigital electrodes was set to about 50 $\mu$m, and the intersecting length of these comb teeth at about 0.6 mm.

Furthermore, in Preferred Embodiment 1, the distance between comb teeth of interdigital electrodes was set at about 200 μm, and the number of comb teeth of each comb-shaped electrode of the interdigital electrodes was set to 6.

Furthermore, in Preferred Embodiment 2, the distance between comb teeth A of interdigital electrodes was set at about 600 μm, the distance between comb teeth B at about 200 μm, and the number of comb teeth of each comb-shaped electrode of the interdigital electrodes was set at 6.

Furthermore, in Preferred Embodiment 3, the distance between comb teeth C of interdigital electrodes was set at about 400 μm, the distance between comb teeth D at about 200 μm, and the number of comb teeth of each comb-shaped electrode of the interdigital electrodes was set at 2.

Then, the piezoelectric members in each of the Preferred Embodiments 1~3 and the Comparative Examples 1~3 were polarized.

More specifically, in each of the Preferred Embodiments 1~3, the piezoelectric member was polarized by connecting to ground one of the comb-shaped electrodes of each interdigital electrode provided on the first surface and on the second surface, while applying a potential of 2~5 kV/mm to the other comb-shaped electrode of each interdigital electrode.

On the other hand, in Comparative Example 1, the piezoelectric member was polarized by connecting one electrode to ground while applying a potential of 3.0 kV/mm to the other electrode. Similarly, in Comparative Example 2, the piezoelectric member was polarized by applying a potential of 3.0 kV/mm, and in Comparative Example 3, a potential of 3.0 kV/mm.

For each of the Preferred Embodiments 1~3 and Comparative Examples 1~3, capacitance, coefficient of electromechanical coupling, and coefficient of mechanical quality were evaluated. These results are shown below in Table 1.

TABLE 1

|  | Capacitance [pF] | Coefficient of Electromechanical Coupling [%] | Coefficient of Mechanical Quality |
| --- | --- | --- | --- |
| Preferred Embodiment 1 | 140 | 47 | 1400 |
| Preferred Embodiment 2 | 120 | 50 | 1500 |
| Preferred Embodiment 3 | 120 | 50 | 1500 |
| Comparative Example 1 | 1100 | 33 | 2200 |
| Comparative Example 2 | 160 | 19 | 1800 |
| Comparative Example 3 | 1 | 52 | 1300 |

As shown clearly in Table 1, in Comparative Example 1, the coefficient of electromechanical coupling is not especially high; moreover, the dimensions are large, making miniaturization of the electronic component difficult. Furthermore, in Comparative Example 2, the coefficient of electromechanical coupling is at its smallest value, restricting the field of application. Furthermore, in Comparative Example 3, capacitance is extremely low, making impedance-matching with a circuit difficult, and placing severe restrictions on the design of a filter or the like.

By contrast, according to the Preferred Embodiments 1~3, a piezoelectric element which has a very small size, has a large coefficient of electromechanical coupling, and is easily impedance-matched to a circuit, can be achieved in each case.

Figure 9:
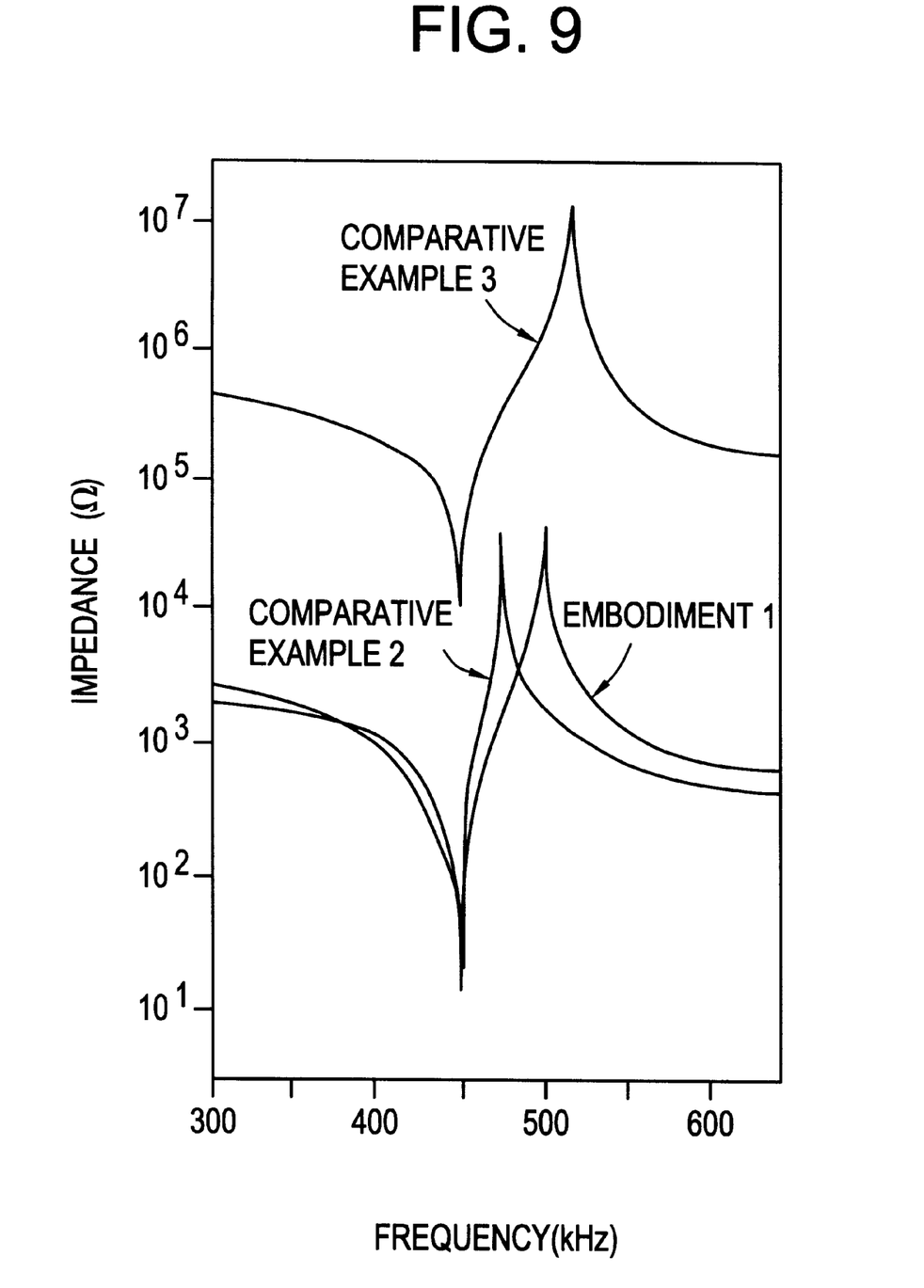
FIG. 9 is a diagram showing impedance-frequency characteristics between terminals close to a resonant frequency in a first preferred embodiment and Comparative Examples 2 and 3, which were evaluated in an experiment performed to confirm the effects of preferred embodiments of the present invention.

Furthermore, FIG. 9 shows impedance-frequency characteristics between terminals near the resonant frequency, determined for Preferred Embodiment 1 and Comparative Examples 2 and 3.

As is clear from FIG. 9, firstly, in Comparative Example 3, there is high impedance, making it difficult to achieve matching with a circuit. Furthermore, in Comparative Example 2, although impedance is low, the difference $\Delta f$ between the resonant frequency and the non-resonant frequency is small, making this awkward for use as a low-pass filter or VCO or the like.

By contrast, the Preferred Embodiment 1 obtains low impedance, and has a resonant frequency of 450 kHz and a nonresonant frequency of 500 kHz, giving a coupling coefficient of approximately 47%. Therefore, according to the Preferred Embodiment 1, matching to a circuit is easy, and a wide pass band can be achieved when it is used as a filter.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric element, comprising:

a piezoelectric member;

means for driving said piezoelectric member; and at least one interdigital electrode including at least two comb-shaped electrodes and provided on at least one polished surface of said piezoelectric member; wherein said piezoelectric member is polarized and said piezoelectric element is adapted to uniformly vibrate in a stiffened mode and thereby expand and contract in a longitudinal direction thereof when said means for driving said piezoelectric member applies an electric filed between said at least two comb-shaped electrodes, and a distance between two electrode fingers of said at least two comb-shaped electrodes of said at least one interdigital electrode located at an approximate center portion of said piezoelectric member is larger than a distance between another two electrode fingers of said at least two comb-shaped electrodes of said at least one interdigital electrode located at an end portion of said piezoelectric member.

2. The piezoelectric element according to claim 1, wherein said piezoelectric member comprises an elongated plate-shaped member.

3. The piezoelectric element according to claim 1, wherein said piezoelectric member comprises a rod-shaped member.

4. The piezoelectric element according to claim 1, wherein said piezoelectric member is made of a piezoelectric ceramic.

5. The piezoelectric element according to claim 1, wherein said at least one interdigital electrode is a first interdigital electrode provided on a first surface of said piezoelectric member, the piezoelectric element further comprising a second interdigital electrode provided on a second surface of said piezoelectric member.

6. The piezoelectric element according to claim 5, wherein an arrangement of said first interdigital electrode on said first surface of said piezoelectric member is a mirror image of an arrangement of said second interdigital electrode provided on said second surface of said piezoelectric member.

7. The piezoelectric element according to claim 1, wherein each of a plurality of portions of the piezoelectric member are polarized in an opposite direction relative to an adjacent one of the portions of the piezoelectric member.

8. The piezoelectric element according to claim 1, wherein said at least one interdigital electrode is a first interdigital electrode provided on a first surface of said piezoelectric member, the piezoelectric element further comprising a second interdigital electrode provided on said first surface of said piezoelectric member.

9. The piezoelectric element according to claim 8, further comprising third and fourth interdigital electrodes provided on a second surface of said piezoelectric member.

10. The piezoelectric element according to claim 9, wherein an arrangement of said first and second interdigital electrodes on said first surface is a mirror image of an arrangement of said third and fourth interdigital electrodes on said second surface of said piezoelectric member.

11. The piezoelectric element according to claim 1, wherein said interdigital electrodes are respectively provided on at least two surfaces of said piezoelectric member which are substantially parallel to each other.

12. The piezoelectric element according to claim 1, wherein one of said comb-shaped electrodes provided on one of the two surfaces of said piezoelectric member, is electrically connected to another of said comb-shaped electrodes provided on the other of said two surfaces of said piezoelectric member.

13. A piezoelectric element, comprising:

a piezoelectric member;

means for driving said piezoelectric member; and at least one interdigital electrode including at least two comb-shaped electrodes and provided on at least one polished surface of said piezoelectric member; wherein said piezoelectric member is polarized such that each of a plurality of portions of the piezoelectric member are polarized in an opposite direction relative to an adjacent one of the portions of the piezoelectric member such that the piezoelectric element uniformly vibrates and expands and contracts in a longitudinal direction thereof, and a distance between two electrode fingers of said at least two comb-shaped electrodes of said at least one interdigital electrode located at an approximate center portion of said piezoelectric member is larger than a distance between another two electrode fingers of said at least two comb-shaped electrodes of said at least one interdigital electrode located at an end portion of said piezoelectric member.

14. A piezoelectric element according to claim 13, wherein said piezoelectric element is adapted to vibrate in a stiffened mode when said means for driving said piezoelectric member applies an electrical field between said two comb-shaped electrodes.

15. The piezoelectric element according to claim 13, wherein said piezoelectric member comprises one of an elongated plate-shaped member and a rod-shaped member.

16. The piezoelectric element according to claim 13, wherein said at least one interdigital electrode is a first interdigital electrode provided on a first surface of said piezoelectric member, the piezoelectric element further comprising a second interdigital electrode provided on a second surface of said piezoelectric member.

17. The piezoelectric element according to claim 16, wherein an arrangement of said first interdigital electrode on said first surface of said piezoelectric member is a mirror image of an arrangement of said second interdigital electrode provided on said second surface of said piezoelectric member.

* * * * *